(12) United States Patent
Liu

(10) Patent No.: US 9,040,991 B2
(45) Date of Patent: May 26, 2015

(54) PIXEL STRUCTURE OF ORGANIC LIGHT EMITTING DEVICE

(71) Applicant: Au Optronics Corporation, Hsinchu (TW)

(72) Inventor: Chun-Yen Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 161 days.

(21) Appl. No.: 13/762,372

(22) Filed: Feb. 8, 2013

(65) Prior Publication Data

US 2013/0146857 A1 Jun. 13, 2013

Related U.S. Application Data

(63) Continuation of application No. 12/905,087, filed on Oct. 15, 2010, now Pat. No. 8,410,481.

(30) Foreign Application Priority Data

Jul. 8, 2010 (TW) .............................. 99122522 A

(51) Int. Cl.
| H01L 29/04 | (2006.01) |
| H01L 27/088 | (2006.01) |
| H01L 27/12 | (2006.01) |
| H01L 27/32 | (2006.01) |

(52) U.S. Cl.
CPC .......... *H01L 27/088* (2013.01); *H01L 27/1255* (2013.01); *H01L 27/3262* (2013.01); *H01L 27/32* (2013.01)

(58) Field of Classification Search
None
See application file for complete search history.

(56) References Cited

U.S. PATENT DOCUMENTS 8,410,481 B2 * 4/2013 Liu ................................. 257/59
2005/0243076 A1 * 11/2005 Kim et al. ..................... 345/204

* cited by examiner

*Primary Examiner* — Bilkis Jahan
*Assistant Examiner* — Kevin Quinto
(74) *Attorney, Agent, or Firm* — Jianq Chyun IP Office

(57) ABSTRACT

A pixel structure including a first scan line, a second scan line, a data line and a power line substantially perpendicular to the first scan line and the second scan line, a reference signal line and an emission signal line substantially parallel with the first scan line and the second scan line, a common thin film transistor (C-TFT), a first pixel unit, and a second pixel unit is provided. The common thin film transistor has a common gate electrode, a common source electrode and a common drain electrode. The common gate electrode is electrically connected to the first scan line, the common drain electrode is electrically connected to the reference signal line. The first and the second pixel units respectively have a first TFT, a second TFT, a third TFT, a fourth TFT, a fifth TFT, a sixth TFT, a capacitor, and an emission device.

18 Claims, 6 Drawing Sheets

PIXEL STRUCTURE OF ORGANIC LIGHT EMITTING DEVICE

CROSS-REFERENCE TO RELATED APPLICATION

This application is a continuation application of and claims the priority benefit of U.S. application Ser. No. 12/905,087, filed on Oct. 15, 2010, now allowed, which claims the priority benefit of Taiwan application serial no. 99122522, filed on Jul. 8, 2010. The entirety of each of the above-mentioned patent applications is hereby incorporated by reference herein and made a part of this specification.

BACKGROUND OF THE INVENTION

1. Field of the Invention

The invention relates to a pixel structure and more particularly to a pixel structure of an organic light emitting device.

2. Description of Related Art

An organic light emitting device is a self-illuminating light emitting device. Displays adopting organic light emitting devices have no limitation in viewing angle, low fabrication cost, high responding speed (about 100 times faster than that of liquid crystals), low power consumption, application in portable devices, wide operation temperature range, and light weight. Moreover, these displays can be miniaturized as required by hardware apparatuses. Thus, the displays adopting organic light emitting devices have high potential in development and may become flat panel displays of the next generation.

A pixel structure of the organic light emitting device in the display is usually driven by the cooperation of a plurality of thin film transistor (TFTs) and a capacitor. However, since a plurality of TFTs is used in the pixel circuit structure, the TFTs must have occupied a certain area in the pixel structure. The pixel circuit structure consequently has no extra space for disposing other components. Or, the pixel circuit structure can not be miniaturized easily and thus can not be applied in displays with high resolution.

SUMMARY OF THE INVENTION

The invention is directed to a pixel structure and a pixel structure of an organic light emitting device, where the pixel structures each can reduce an area occupied by components of the pixel structure.

The invention is directed to a pixel structure of an organic light emitting device. The pixel structure includes a first scan line and a second scan line, a data line and a power line substantially perpendicular to the first scan line and the second scan line, an emission signal line and a reference signal line substantially parallel with the first scan line and the second scan line, a common thin film transistor (C-TFT), and a first pixel unit and a second pixel unit. The common TFT has a common gate electrode, a common source electrode, and a common drain electrode. The common gate electrode is electrically connected to the first scan line, and the common drain electrode is electrically connected to the reference signal line. The first pixel unit and the second pixel unit respectively have a first TFT, a second TFT, a third TFT, a fourth TFT, a fifth TFT and a sixth TFT, a capacitor, and an emission device. The first TFT has a first gate electrode, a first source electrode, and a first drain electrode. The first gate electrode is electrically connected to the first scan line, and the first drain electrode is electrically connected to the common source electrode of the common TFT. The second TFT has a second gate electrode, a second source electrode, and a second drain electrode. The second gate electrode is electrically connected to the emission signal line. The capacitor has a first capacitive electrode and a second capacitive electrode. The first capacitive electrode is electrically connected to the first source electrode of the first TFT. The second capacitive electrode is electrically connected to the second drain electrode of the second TFT. The third TFT has a third gate electrode, a third source electrode, and a third drain electrode. The third gate electrode is electrically connected to the second scan line, and the third drain electrode is electrically connected to the first source electrode of the first TFT. The fourth TFT has a fourth gate electrode, a fourth source electrode, and a fourth drain electrode. The fourth gate electrode is electrically connected to the first source electrode of the first TFT and the third drain electrode of the third TFT, and the fourth source electrode is electrically connected to the second source electrode of the second TFT. The fifth TFT has a fifth gate electrode, a fifth source electrode, and a fifth drain electrode. The fifth gate electrode is electrically connected to the emission signal line. The fifth source electrode is electrically connected to the fourth drain electrode of the fourth TFT and the third source electrode of the third TFT. The sixth TFT has a sixth gate electrode, a sixth source electrode, and a sixth drain electrode. The sixth gate electrode is electrically connected to the second scan line. The sixth source electrode is electrically connected to the data line. The sixth drain electrode is electrically connected to the second source electrode of the second TFT and the fourth source electrode of the fourth TFT. The emission device is electrically connected to the drain electrode of the fifth TFT.

The invention is directed to a pixel structure including a first scan line and a second scan line, a data line and a power line substantially perpendicular to the first scan line and the second scan line, an emission signal line and a reference signal line substantially parallel with the first scan line and the second scan line, a common TFT, and a first pixel unit and a second pixel unit. The common TFT has a common gate electrode, a common source electrode, and a common drain electrode. The common gate electrode is electrically connected to the first scan line, and the common drain electrode is electrically connected to the reference signal line. The first pixel unit and the second pixel unit respectively have a first TFT, a second TFT, a third TFT, a fourth TFT, a fifth TFT and a sixth TFT, and a capacitor. The first TFT has a first gate electrode, a first source electrode, and a first drain electrode. The first gate electrode is electrically connected to the first scan line, and the first drain electrode is electrically connected to the common source electrode of the common TFT. The second TFT has a second gate electrode, a second source electrode, and a second drain electrode. The second gate electrode is electrically connected to the emission signal line. The capacitor has a first capacitive electrode and a second capacitive electrode. The first capacitive electrode is electrically connected to the first source electrode of the first TFT. The second capacitive electrode is electrically connected to the second drain electrode of the second TFT. The third TFT has a third gate electrode, a third source electrode, and a third drain electrode. The third gate electrode is electrically connected to the second scan line, and the third drain electrode is electrically connected to the first source electrode of the first TFT. The fourth TFT has a fourth gate electrode, a fourth source electrode, and a fourth drain electrode. The fourth gate electrode is electrically connected to the first source electrode of the first TFT and the third drain electrode of the third TFT. The fourth source electrode is electrically connected to the second source electrode of the second TFT. The fifth TFT has a fifth gate electrode, a fifth source electrode, and a fifth drain electrode. The fifth gate electrode is electrically connected to the emission signal line. The fifth source electrode is electrically connected to the fourth drain electrode of the fourth TFT and the third source electrode of the third TFT. The sixth TFT has a sixth gate electrode, a sixth source electrode, and a sixth drain electrode. The sixth gate electrode is electrically connected to the second scan line. The sixth source electrode is electrically connected to the data line. The sixth drain electrode is electrically connected to the second source electrode of the second TFT and the fourth source electrode of the fourth TFT.

In light of the foregoing, as the first pixel unit and the second pixel unit of the pixel structure in the invention share the common TFT, a pixel area occupied by the TFTs respectively in the first pixel unit and the second pixel unit of the pixel structure can be saved. Hence, the area of the pixel structure is reduced for the pixel structure to be applied in high resolution product. The space saved in the pixel structure can also be used for disposing other devices or components when the pixel structure is not to be miniaturized.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
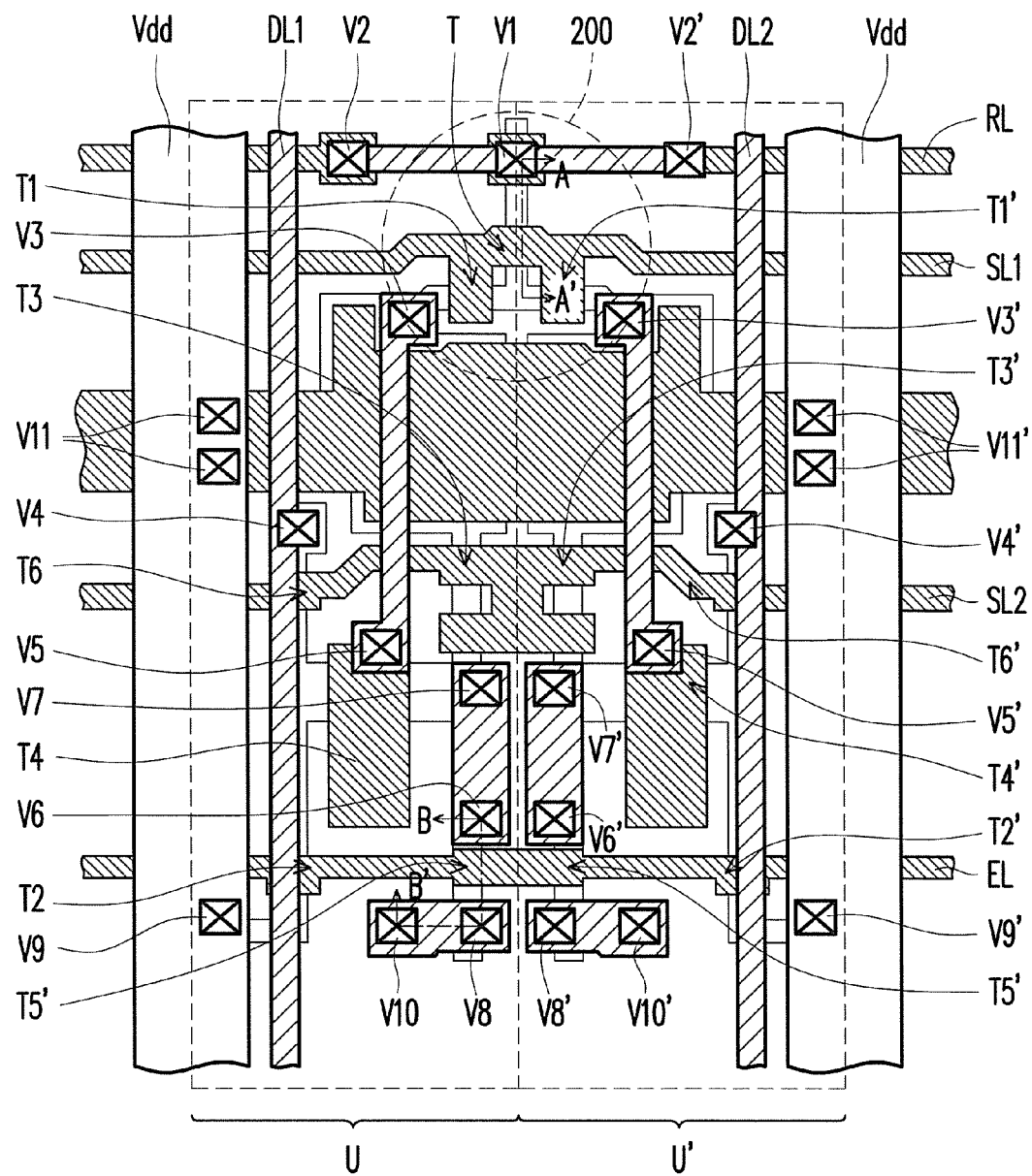
FIG. 1 illustrates a schematic top view of a pixel structure according to an embodiment of the invention.
Figure 2:
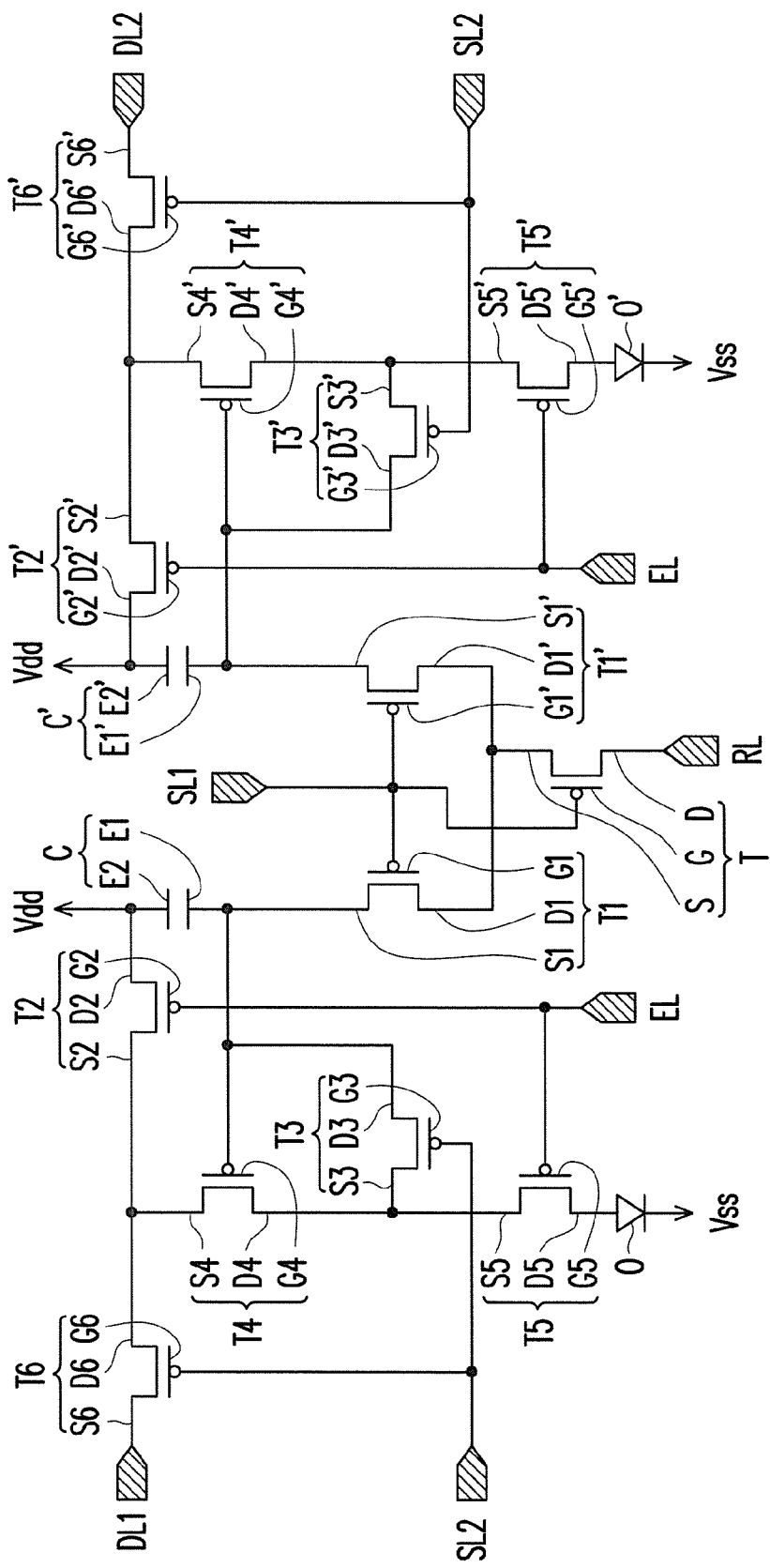
FIG. 2 illustrates an equivalent circuit diagram of the pixel structure in FIG. 1.

FIG. 1 illustrates a schematic top view of a pixel structure of an organic light emitting device according to an embodiment of the invention. FIG. 2 illustrates an equivalent circuit diagram of the pixel structure in FIG. 1. To illustrate the invention in detail, film layers of an emission device are omitted in the pixel structure of FIG. 1. The layers of the emission device are described in subsequent paragraphs.

Referring to FIGS. 1 and 2, a pixel structure of the present embodiment includes a first scan line SL1 and a second scan line SL2, data lines DL1 and DL2, a reference signal line RL, an emission signal line EL, a common thin film transistor (TFT) T, a first pixel unit U and a second pixel unit U1.

The first scan line SL1, the second scan line SL2, and the data lines DL1 and DL2 are disposed on a substrate. The data lines DL1 and DL2 are disposed substantially perpendicular to the first scan line SL1 and the second scan line SL2. In other words, an extending direction of the data lines DL1 and DL2 is perpendicular to an extending direction of the first scan line SL1 and the second scan line SL2. The first scan line SL1 and the second scan line SL2 are in different layers with the data lines DL1 and DL2. The first scan line SL1, the second scan line SL2, and the data lines DL1 and DL2 are fabricated using metal material for conductivity. However, the invention is not limited thereto.

The reference signal line RL is disposed on the substrate. According to the present embodiment, the reference signal line RL is disposed substantially parallel to the first scan line SL1 and the second scan line SL2. In other words, an extending direction of the reference signal line RL is parallel to an extending direction of the first scan line SL1 and the second scan line SL2. However, the invention is not limited thereto. According to other embodiments, the reference signal line RL can also be disposed parallel to the data lines DL1 and DL2. In the present embodiment, a portion of the reference signal line RL and the data lines DL1 and DL2 are in the same layer, and another portion of the reference signal line RL, the first scan line SL1, and the second scan line SL2 are in the same layer. The two portions of the reference signal line RL are electrically connected through contact windows V2 and V2'.

The emission signal line EL is disposed on the substrate. According to the present embodiment, the emission signal line EL is disposed substantially parallel to the first scan line SL1 and the second scan line SL2. In other words, an extending direction of the emission signal line EL is parallel to an extending direction of the first scan line SL1 and the second scan line SL2.

The common TFT T has a common gate electrode G, a common source electrode S, and a common drain electrode D. The common gate electrode G is electrically connected to the first scan line SL1, and the common drain electrode D is electrically connected to the reference signal line RL. According to the present embodiment, the common drain electrode D is electrically connected to the reference signal line RL through a contact window V1.

The first pixel unit U has a first TFT T1, a second TFT T2, a third TFT T3, a fourth TFT T4, a fifth TFT T5, a sixth TFT T6, a capacitor C, and an emission device O. The second pixel unit U' has a first TFT T1', a second TFT T2', a third TFT T3', a fourth TFT T4', a fifth TFT T5', a sixth TFT T6', a capacitor C', and an emission device O'.

In the first pixel unit U, the first TFT T1 has a first gate electrode G1, a first source electrode S1, and a first drain electrode D1. The first gate electrode G1 is electrically connected to the first scan line SL1. The first drain electrode D1 is electrically connected to the common source electrode S of the common TFT T.

The second TFT T2 has a second gate electrode G2, a second source electrode S2, and a second drain electrode D2. The second gate electrode G2 is electrically connected to the emission signal line EL.

The capacitor C has a first capacitive electrode E1 and a second capacitive electrode E2. The first capacitive electrode E1 is electrically connected to the first source electrode S1 of the first TFT T1. The second capacitive electrode E2 is electrically connected to the second drain electrode D2 of the second TFT T2.

According to an embodiment of the invention, the second drain electrode D2 of the second TFT T2 and the second capacitive electrode E2 of the capacitor C are electrically connected to the first power line (Vdd). Here, the second drain electrode D2 of the second TFT T2 is electrically connected to the first power line (Vdd) through a contact window V9. The second capacitive electrode E2 of the capacitor C is electrically connected to the first power line (Vdd) through a contact window V11.

The third TFT T3 has a third gate electrode G3, a third source electrode S3, and a third drain electrode D3. The third gate electrode G3 is electrically connected to the second scan line SL2, and the third drain electrode D3 is electrically connected to the first source electrode S1 of the first TFT T1.

The fourth TFT T4 has a fourth gate electrode G4, a fourth source electrode S4, and a fourth drain electrode D4. The fourth gate electrode G4 is electrically connected to the first source electrode S1 of the first TFT T1 and the third drain electrode D3 of the third TFT T3. The fourth source electrode S4 is electrically connected to the second source electrode S2 of the second TFT T2. Herein, the fourth gate electrode G4 is electrically connected to the first drain electrode D1 of the first TFT T1 through contact windows V3 and V5.

The fifth TFT T5 has a fifth gate electrode G5, a fifth source electrode S5, and a fifth drain electrode D5. The fifth gate electrode G5 is electrically connected to the emission signal line EL. The fifth source electrode S5 is electrically connected to the fourth drain electrode D4 of the fourth TFT T4 and the third source electrode S3 of the third TFT T3. Here, the fifth source electrode S5 is electrically connected to the fourth drain electrode D4 of the fourth TFT T4 through contact windows V6 and V7.

The sixth TFT T6 has a sixth gate electrode G6, a sixth source electrode S6, and a sixth drain electrode D6. The sixth gate electrode G6 is electrically connected to the second scan line SL2. The sixth source electrode S6 is electrically connected to the data line DL1. The sixth drain electrode D6 is electrically connected to the second source electrode S2 of the second TFT T2 and the fourth source electrode S4 of the fourth TFT T4. Here, the sixth source electrode S6 is electrically connected to the data line DL1 through a contact window V4.

The emission device O is electrically connected to the fifth drain electrode D5 of the fifth TFT T5. Here, the emission device O is electrically connected to the drain electrode D5 of the fifth TFT T5 through contact windows V8 and V10.

In the second pixel unit U', the first TFT T1' has a first gate electrode G1', a first source electrode S1', and a first drain electrode D1'. The first gate electrode G1' is electrically connected to the first scan line SL1. The first drain electrode D1' is electrically connected to the common source electrode S of the common TFT T.

The second TFT T2' has a second gate electrode G2', a second source electrode S2', and a second drain electrode D2'. The second gate electrode G2' is electrically connected to the emission signal line EL.

The capacitor C' has a first capacitive electrode E1' and a second capacitive electrode E2'. The first capacitive electrode E1' is electrically connected to the first source electrode S1' of the first TFT T1'. The second capacitive electrode E2' is electrically connected to the second drain electrode D2' of the second TFT T2'.

According to an embodiment of the invention, the second drain electrode D2' of the second TFT T2' and the second capacitive electrode E2' of the capacitor C' are electrically connected to the first power line (Vdd). Here, the second drain electrode D2' of the second TFT T2' is electrically connected to the first power line (Vdd) through a contact window V9'. The second capacitive electrode E2' of the capacitor C' is electrically connected to the first power line (Vdd) through a contact window V11'.

The third TFT T3' has a third gate electrode G3', a third source electrode S3', and a third drain electrode D3'. The third gate electrode G3' is electrically connected to the second scan line SL2, and the third drain electrode D3' is electrically connected to the first source electrode S1' of the first TFT T1'.

The fourth TFT T4' has a fourth gate electrode G4', a fourth source electrode S4', and a fourth drain electrode D4'. The fourth gate electrode G4' is electrically connected to the first source electrode S1' of the first TFT T1' and the third drain electrode D3' of the third TFT T3'. The fourth source electrode S4' is electrically connected to the second source electrode S2' of the second TFT T2'. The fourth gate electrode G4' is electrically connected to the first source electrode S1' of the first TFT T1' through contact windows V3' and V5'.

The fifth TFT T5' has a fifth gate electrode G5', a fifth source electrode S5', and a fifth drain electrode D5'. The fifth gate electrode G5' is electrically connected to the emission signal line EL. The fifth source electrode S5' is electrically connected to the fourth drain electrode D4' of the fourth TFT T4' and the third source electrode S3' of the third TFT T3'. Here, the fifth source electrode S5' is electrically connected to the fourth drain electrode D4' of the fourth TFT T4' through contact windows V6' and V7'.

The sixth TFT T6' has a sixth gate electrode G6', a sixth source electrode S6', and a sixth drain electrode D6'. The sixth gate electrode G6' is electrically connected to the second scan line SL2. The sixth source electrode S6' is electrically connected to the data line DL2. The sixth drain electrode D6' is electrically connected to the second source electrode S2' of the second TFT T2' and the fourth source electrode S4' of the fourth TFT T4'. The sixth source electrode S6' is electrically connected to the data line DL2 through a contact window V4'.

The emission device O' is electrically connected to the fifth drain electrode D5' of the fifth TFT T5'. Here, the emission device O' is electrically connected to the drain electrode D5' of the fifth TFT T5' through contact windows V8' and V10'.

Figure 3:
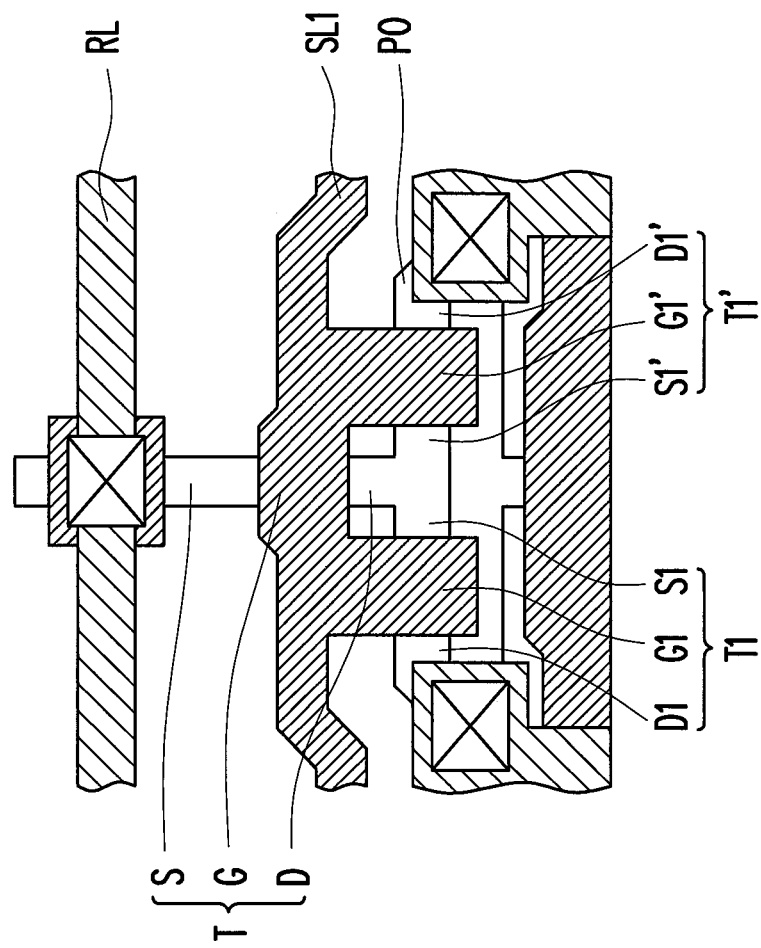
FIG. 3 is a schematic enlarged view of a notation 200 in FIG. 1.

FIG. 3 is a schematic enlarged view of a notation 200 in FIG. 1. Accordingly, the common TFT T is disposed at a border of the first pixel unit U and the second pixel unit U'. Thus, the first pixel unit U and the second pixel unit U' of the invention can share the common TFT T. Since the first pixel unit U and the second pixel unit U' can share the common TFT T, this pixel structure design can save about 8.8% of the area comparing to the pixel structure design not adopting the common TFT. That is, with the present size of the pixel structure, another 8.8% of the area can be saved. The space saved can be used for disposition of other components or devices. On the other hand, the size of pixels can be reduced for application in displays with high resolution.

It should be noted that the common TFT T, the first TFTs T1, T1', the second TFTs T2, T2', the third TFTs T3, T3', the fourth TFTs T4, T4', the fifth TFTs T5, T5', and the sixth TFTs T6, T6' can be selected from a group consisting of an amorphous silicon TFT, a poly-silicon TFT, and an oxide TFT, or a combination thereof. When the poly-silicon TFT is adopted as an example, the TFT has a structure as follows.

Figure 4:
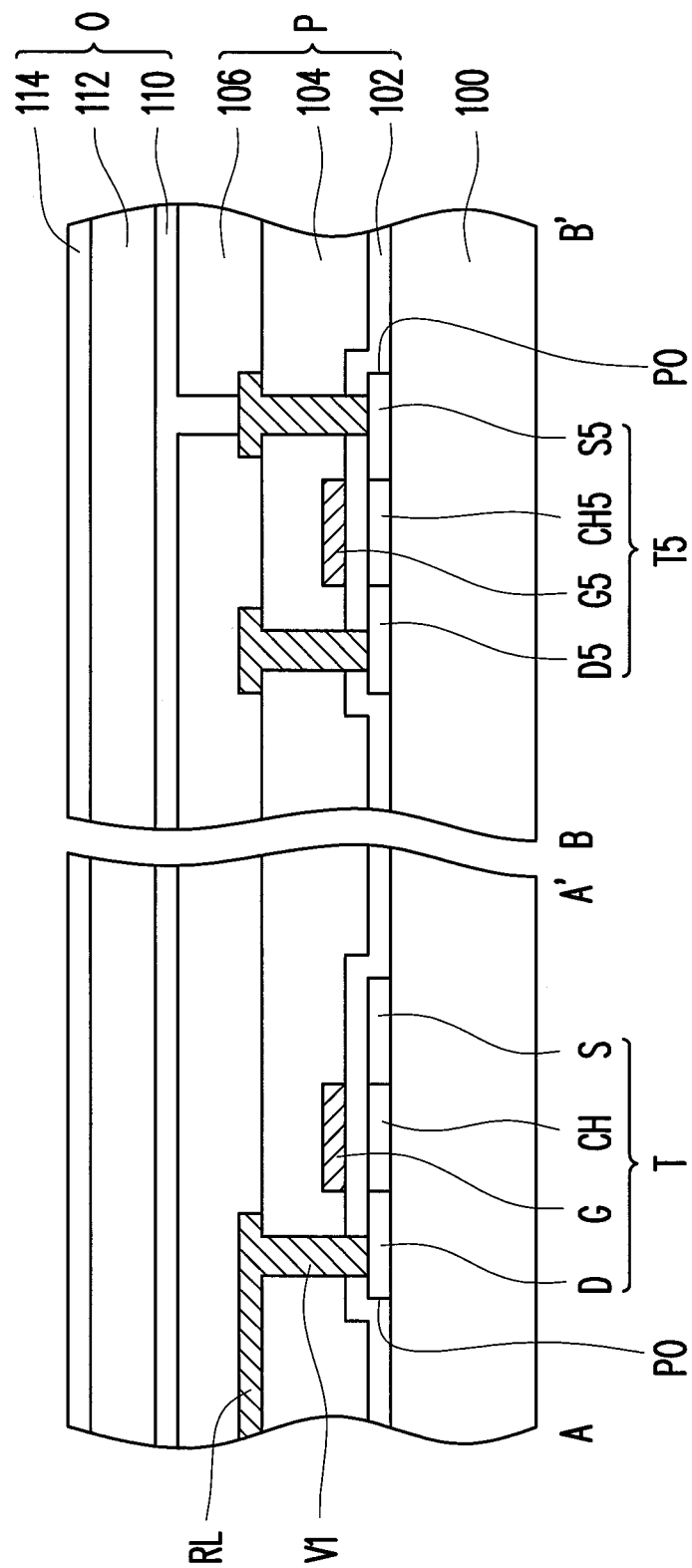
FIG. 4 depicts a schematic cross-sectional view taken along line A-A' and line B-B' in FIG. 1.

FIG. 4 depicts a schematic cross-sectional view taken along line A-A' and line B-B' in FIG. 1. FIG. 4 depicts a structure of a poly-silicon TFT by using a cross-section of a common TFT and a cross-section of a fifth TFT as examples. In practice, the first, the second, the third, the fourth, and the sixth TFTs have similar structures. Referring to FIG. 4, a common TFT T includes a poly-silicon layer disposed on a substrate 100. The common TFT includes a source electrode S, a channel CH, and a drain electrode D. An insulation layer 102 covers the poly-silicon layer. The gate electrode G is disposed on the insulation layer 102 above the channel CH. Similarly, the fifth TFT T5 includes a poly-silicon layer PO disposed on the substrate 100. The fifth TFT T5 includes a source electrode S5, a channel CH5, and a drain electrode D5.

The insulation layer 102 covers the poly-silicon layer PO. The gate electrode G5 is disposed on the insulation layer 102 above the channel CH5.

In addition, an insulation layer 104 covers the common TFT T and the fifth TFT T5. A reference signal line RL is disposed on the insulation layer 104 and electrically connected to the drain electrode D through a contact window V1. A source electrode and a drain electrode metal layer (not shown) are further disposed in the insulation layer 104 and respectively electrically connected to the first source electrode S5 and the fifth drain electrode D5.

The layer disposed with the TFT is also referred as a pixel structure layer P. An emission device O is further disposed above the pixel structure layer P to form a pixel structure of an organic light emitting device.

Specifically, an insulation layer 106 covers the insulation layer 104 and a first electrode layer 110 is disposed thereon. The first electrode layer 110 is electrically connected to the drain electrode D5 of the fifth TFT T5. According to the present embodiment, the first electrode layer 110 and the fifth drain electrode D5 of the fifth TFT T5 are electrically connected through a contact window V10.

An emission layer 112 is disposed on the first electrode layer 110. The emission layer 112 is an organic emission layer or an inorganic emission layer. The organic light emitting device is referred as an organic organic light emitting device or an inorganic organic light emitting device based on the material used in the emission layer 112. Moreover, the emission layer 112 of the emission device O, O' of each pixel unit U or U' is categorized into a red organic emission pattern, a green organic emission pattern, a blue organic emission pattern, or an emission pattern of other colors generated by mixing light of various spectra (i.e., white, orange, purple, and so on).

A second electrode layer 114 is disposed on the emission layer 112. According to an embodiment of the invention, the second electrode layer 114 of the emission device O is electrically connected to a second power line (Vss). According to other embodiments, the emission device O can further include an electron transmission layer, an electron injection layers, a hole transmission layer, and a hole injection layer (not shown).

A portion of the reference signal line RL of the pixel structure of the organic light emitting device and the scan line are in the same layer. Another portion of the reference signal line RL and the data line are in the same layer. However, the invention is not limited thereto. According to other embodiments, the reference signal line RL can also be disposed on other layers as described in the following.

Figure 5:
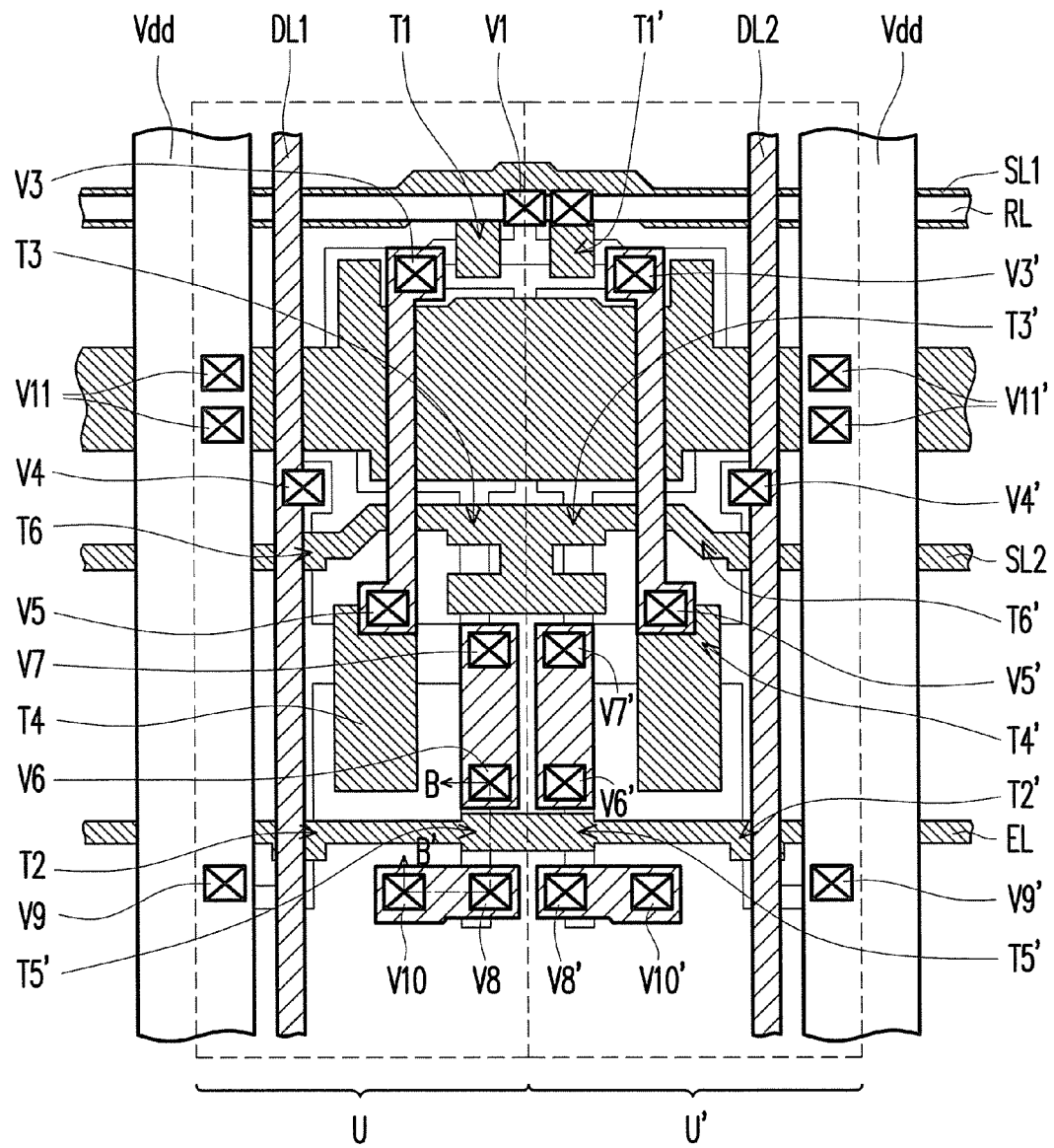
FIG. 5 illustrates a schematic top view of a pixel structure according to another embodiment of the invention.
Figure 6:
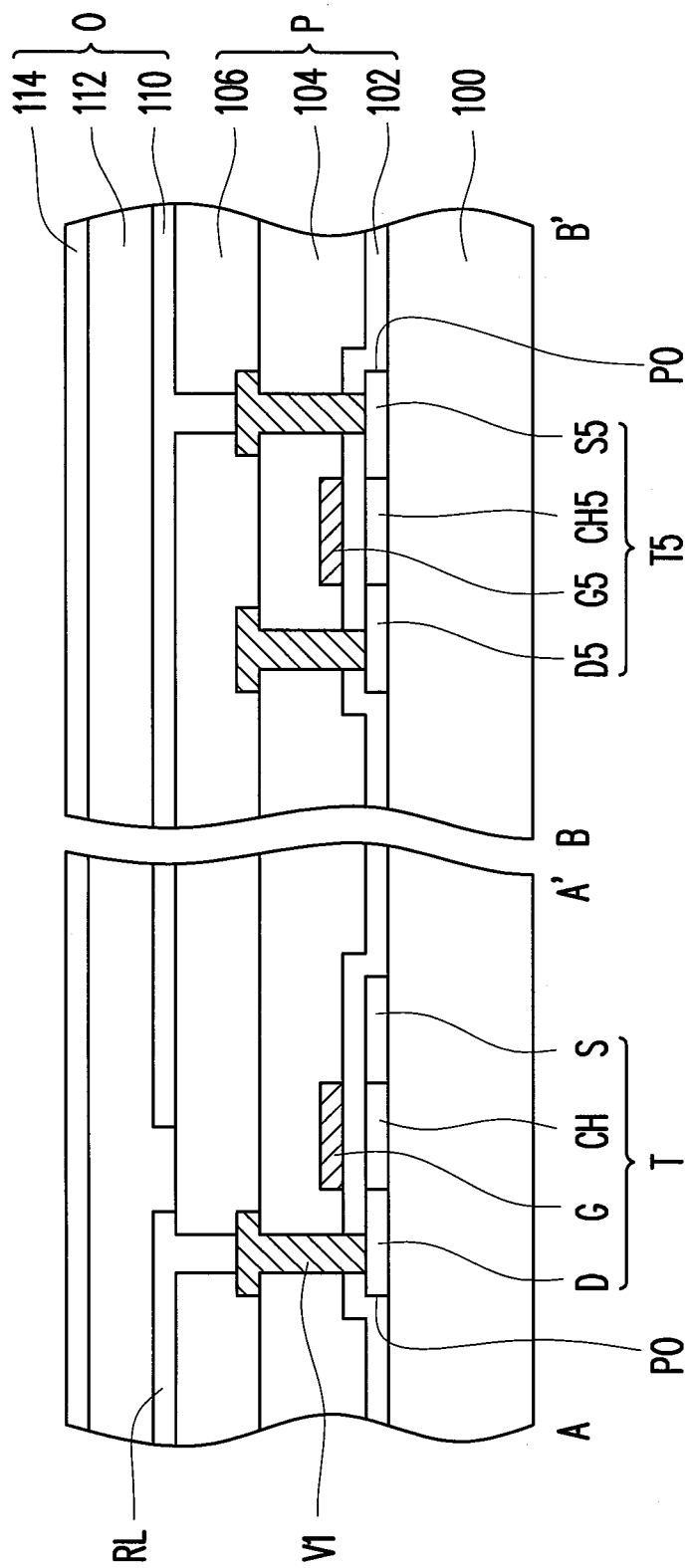
FIG. 6 depicts a schematic cross-sectional view taken along line A-A' and line B-B' in FIG. 5.

FIG. 5 illustrates a schematic top view of a pixel structure according to another embodiment of the invention. FIG. 6 depicts a schematic cross-sectional view taken along line A-A' and line B-B' in FIG. 5. Referring to FIGS. 5 and 6, the embodiments of FIGS. 5 and 6 are similar to the embodiments of FIGS. 1 and 4; thus, identical elements are denoted with the same notations are not described repeatedly. The embodiments of FIGS. 5 and 6 are different from the embodiments of FIGS. 1 and 4 in that the reference signal line RL and the first electrode layer 110 of the emission device O are in the same layer. According to the present embodiment, the reference signal line RL and the drain electrode D of the common TFT T are electrically connected through a contact window V1.

In the present embodiment, since the reference signal line RL and the first electrode layer 110 of the emission device O are disposed in the same layer, the reference signal line RL can be disposed in overlap with the first scan line SL1. In other words, the reference signal line RL is disposed on top of the first scan line SL1. Thus, the space occupied by components or devices in the pixel structure can be further reduced.

In summary, as the first pixel unit and the second pixel unit of the pixel structure in the invention share the common TFT, a pixel area occupied by the TFTs respectively in the first pixel unit and the second pixel unit of the pixel structure can be reduced. Hence, the area of the pixel structure is reduced for the pixel structure to be applied in high resolution product. The space saved in the pixel structure can also be used for disposing other devices or components when the pixel structure is not to be miniaturized.

Also, in the invention, the reference signal line is further disposed in the same layer with the first electrode layer of the emission device. As a consequence, the reference signal line can be disposed on top of the first scan line. Thus, the space occupied by components or devices in the pixel structure can be further reduced.

It will be apparent to those skilled in the art that various modifications and variations can be made to the structure of the disclosed embodiments without departing from the scope or spirit of the disclosure.

In view of the foregoing, it is intended that the disclosure cover modifications and variations of this disclosure provided they fall within the scope of the following claims and their equivalents.

What is claimed is:

1. A pixel structure of an organic light emitting device, comprising:
   a first scan line and a second scan line;
   a data line, crossed to the first scan line and the second scan line;
   a reference signal line;
   an emission signal line;
   a common gate electrode, and a common drain electrode, the common drain electrode being electrically connected to the reference signal line; and
   a first pixel unit and a second pixel unit, each of the first pixel unit and the second pixel unit electrically connected to the first scan line, the second scan line, the data line, the emission signal line and the reference signal line, wherein each of the first pixel unit and the second pixel unit comprises:
   a first thin film transistor including a first gate electrode, a first source electrode, and a first drain electrode, wherein:
   the first gate electrode of the first pixel unit, the first gate electrode of the second pixel unit and the common gate electrode are all electrically connected with the first scan line; and
   both of the first drain electrode of the first pixel unit and the first drain electrode of the second pixel unit are electrically connected with the reference signal line through the common drain electrode.

2. The pixel structure of the organic light emitting device as claimed in claim 1, wherein a portion of the reference signal line, the first scan line, and the second scan line are in the same layer, and another portion of the reference signal line and the data line are in the same layer.

3. The pixel structure of the organic light emitting device as claimed in claim 1, wherein the reference signal line, the first scan line, and the second scan line are in different layers.

4. The pixel structure of the organic light emitting device as claimed in claim 1, wherein the reference signal line and the first scan line are disposed in overlap.

5. The pixel structure of the organic light emitting device as claimed in claim 1, wherein the data line is disposed substantially perpendicular to the first scan line and the second scan line.

6. The pixel structure of the organic light emitting device as claimed in claim 1, wherein the emission signal line is disposed substantially parallel to the first scan line and the second scan line.

7. The pixel structure of the organic light emitting device as claimed in claim 1, wherein the reference signal line and the common drain electrode are electrically connected through a contact window.

8. The pixel structure of the organic light emitting device as claimed in claim 1, wherein each of the first pixel unit and the second pixel unit further comprises a second thin film transistor, a capacitor and an emission device, wherein the capacitor is electrically between the first thin film transistor and the second thin film transistor, and wherein the emission device is electrically connected with the second thin film transistor.

9. The pixel structure of the organic light emitting device as claimed in claim 1, wherein the first drain electrode of the first thin film transistor is electrically connected to the common drain electrode of a common thin film transistor, and wherein each of the first pixel unit and the second pixel unit further comprises:
  a second thin film transistor, having a second gate electrode, a second source electrode, and a second drain electrode, the second gate electrode being electrically connected to the emission signal line;
  a capacitor, having a first capacitive electrode and a second capacitive electrode, the first capacitive electrode being electrically connected to the first source electrode of the first thin film transistor, and the second capacitive electrode being electrically connected to the second drain electrode of the second thin film transistor;
  a third thin film transistor, having a third gate electrode, a third source electrode, and a third drain electrode, the third gate electrode being electrically connected to the second scan line, the third drain electrode being electrically connected to the first source electrode of the first thin film transistor;
  a fourth thin film transistor, having a fourth gate electrode, a fourth source electrode, and a fourth drain electrode, the fourth gate electrode being electrically connected to the first source electrode of the first thin film transistor and the third drain electrode of the third thin film transistor, and the fourth source electrode being electrically connected to the second source electrode of the second thin film transistor;
  a fifth thin film transistor, having a fifth gate electrode, a fifth source electrode, and a fifth drain electrode, the fifth gate electrode being electrically connected to the emission signal line, the fifth source electrode being electrically connected to the fourth drain electrode of the fourth thin film transistor and the third source electrode of the third thin film transistor;
  a sixth thin film transistor, having a sixth gate electrode, a sixth source electrode, and a sixth drain electrode, the sixth gate electrode being electrically connected to the second scan line, the sixth source electrode being electrically connected to the data line, and the sixth drain electrode being electrically connected to the second source electrode of the second thin film transistor and the fourth source electrode of the fourth thin film transistor; and
  an emission device, electrically connected to the drain electrode of the fifth thin film transistor.

10. The pixel structure of the organic light emitting device as claimed in claim 9, wherein the second drain electrode of the second thin film transistor and the second capacitive electrode of the capacitor are electrically connected to a first power line (Vdd).

11. The pixel structure of the organic light emitting device as claimed in claim 9, wherein the emission device comprises:
  a first electrode layer, electrically connected to the drain electrode of the fifth thin film transistor;
  an emission layer, located on the first electrode layer; and
  a second electrode layer, located on the emission layer.

12. The pixel structure of the organic light emitting device as claimed in claim 11, wherein the reference signal line and the first electrode layer of the emission device are in the same layer.

13. The pixel structure of the organic light emitting device as claimed in claim 11, wherein the first electrode layer of the emission device and the fifth drain electrode of the fifth thin film transistor are electrically connected through a contact window.

14. The pixel structure of the organic light emitting device as claimed in claim 11, wherein the second electrode layer of the emission device is electrically connected to a second power line (Vss).

15. The pixel structure of the organic light emitting device as claimed in claim 9, wherein the common thin film transistor, the first thin film transistor, the second thin film transistor, the third thin film transistor, the fourth thin film transistor, the fifth thin film transistor, and the sixth thin film transistor are selected from a group consisting of an amorphous silicon thin film transistor, a poly-silicon thin film transistor, and an oxide thin film transistor, or a combination thereof.

16. A pixel structure of an organic light emitting device, comprising:
  a first scan line and a second scan line;
  a first data line and a second data line, crossed to the first scan line and the second scan line;
  a reference signal line;
  an emission signal line;
  a first pixel unit electrically connected with the first data line; and
  a second pixel unit electrically connected with the second data line, wherein each of the first and second pixel units comprises:
    a first thin film transistor, a second thin film transistor, a capacitor and an emission device, wherein the capacitor is electrically between the first thin film transistor and the second thin film transistor, the emission device is electrically connected with the second thin film transistor, and wherein the first thin film transistor of the first pixel unit and that of the second pixel unit are both electrically connected with the reference signal line.

17. The pixel structure of the organic light emitting device as claimed in claim 16, wherein the first thin film transistor of the first pixel unit and that of the second pixel unit are both electrically connected with the reference signal line through a common drain electrode.

18. The pixel structure of the organic light emitting device as claimed in claim 17, wherein a first gate electrode of the first thin film transistor of the first pixel unit and that of the second pixel unit are both electrically connected with the first scan line.

* * * * *